United States Patent [19]

Okamura et al.

[11] Patent Number: 4,916,582
[45] Date of Patent: Apr. 10, 1990

[54] ELECTRONIC COMPONENT AND ITS PRODUCTION METHOD

[75] Inventors: Hisatake Okamura; Teruhisa Tsuru; Tetsuo Taniguchi, all of Kyoto, Japan

[73] Assignee: Murata Manufacturing Co., Ltd., Nagaokakyo, Japan

[21] Appl. No.: 335,258

[22] Filed: Apr. 10, 1989

[30] Foreign Application Priority Data

Dec. 20, 1988 [JP] Japan ................................. 63-323116

[51] Int. Cl.⁴ .......................... H01G 4/10; H01G 7/00; H01P 1/20
[52] U.S. Cl. ..................................... 361/321; 333/202; 29/25.42
[58] Field of Search ................ 333/202; 361/328, 330, 361/306, 321; 29/25.42

[56] References Cited

U.S. PATENT DOCUMENTS

| | | | |
|---|---|---|---|
| 4,470,099 | 9/1984 | Sawairi | 361/328 |
| 4,573,101 | 2/1986 | Takeno | 361/321 |
| 4,754,242 | 6/1988 | Okamura et al. | 333/175 |

Primary Examiner—Donald A. Griffin
Attorney, Agent, or Firm—Armstrong, Nikaido, Marmelstein, Kubovcik & Murray

[57] ABSTRACT

The present invention discloses an electronic component such as an inductor, a bandpass filter, or a duplexer wherein an electronic component core and shielding electrode layers interpose intermediate layers made of a non-metal material. The present invention also discloses a production method of an electronic component. The production method comprises a first step of laminating intermediate layers, shielding electrode layers, and protective layers in this order on both main surfaces of an electronic component core in order to form a laminated body; and a second step of baking the laminated body.

21 Claims, 10 Drawing Sheets

Fig. 19 ated body.

ELECTRONIC COMPONENT AND ITS PRODUCTION METHOD

BACKGROUND OF THE INVENTION

Field of the Invention

This invention refers to an electronic component such as an inductor, a bandpass filter, or a duplexer, and its production method. In the above product, a non-metal core layer has conductive lands formed on one or both surfaces thereof, and the obtained item is shielded.

Description of the Prior Art

Figure 1:
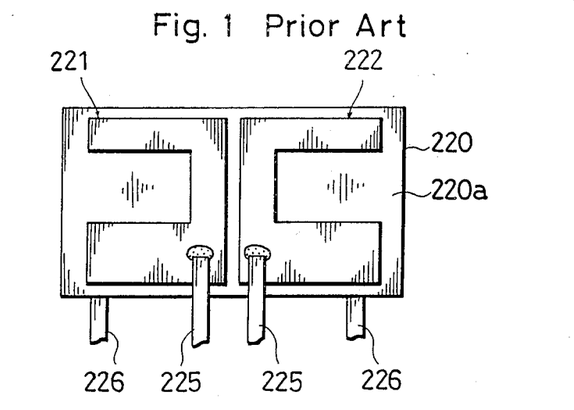
FIG. 1 is a front view of a conventional bandpass filter.

A conventional bandpass filter will be explained as an example of the prior art. FIG. 1 shows a front view of a bandpass filter, FIG. 2 a bottom view of the same, and FIG. 3 a rear view of the same.

Figure 2:
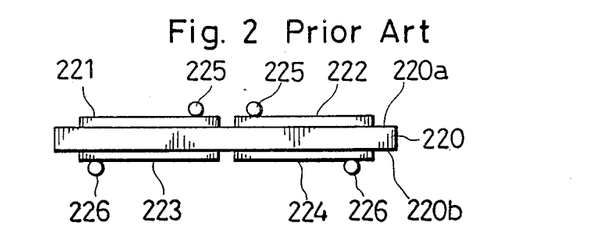
FIG. 2 is a bottom view of the same.
Figure 3:
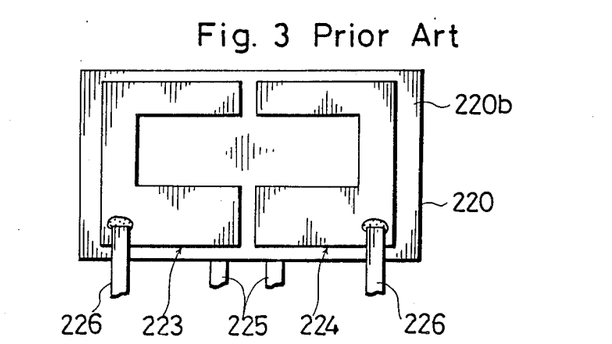
FIG. 3 is a rear view of the same.

As shown in FIGS. 1, 2 and 3, a dielectric layer 220 has substantially C-shaped conductive lands 221 and 222 symmetrically arranged on its upper surface and substantially C-shaped conductive lands 223 and 224 symmetrically arranged on its bottom surface. The conductive lands 221 and 222 are soldered with grounding terminals 225, and the conductive lands 223 and 224 are soldered with external lead terminals 226. Such a bandpass filter is molded and shielded in the following manner.

The whole part of the bandpass filter, excluding the projecting portions of the grounding terminals 225 and the external lead terminals 226, is immersed in an insulating resin bath, whereby the bandpass filter is wrapped up by a resin film (not shown). The obtained item is further wrapped up with a magnetic substance (not shown).

Such a shielding method prevents the frequency characteristic of the bandpass filter from declining even if it is approached by a metal or other conductors. This shielding method is employed for other electronic components as well as for a bandpass filter.

When the above shielding method is applied, however, magnetic permeability of the shielding magnetic substance varies in accordance with the frequency characteristic. In consequence, the magnetic permeability drops in a high frequency range to the level where the shielding effect is not enough.

Furthermore, the above production method requires many processes such as core layer baking, conductive lands forming, terminal soldering, immersing and shielding.

In recent years, another production method has been proposed, where shielding electrodes are incorporated in the bandpass filter, and the obtained item is baked. By this method, baking does not have to be done as many times by the above conventional method. However, this proposed method has a problem that the bandpass filter core inside the shielding electrodes declines its Q factor to have low quality.

SUMMARY OF THE INVENTION

Accordingly, the present invention has an object of providing an electronic component such as an inductor, a bandpass filter, or a duplexer which prevents the Q factor from declining.

Another object of this invention is to offer an electronic component whose frequency characteristic is not affected by a metal or other conductors.

Still another object of this invention is to offer a simple and low-cost production method of such an electronic component.

The above objects are fulfilled by an electronic component comprising an electronic component core comprising at least one core layer formed of a non-metal material, which has at least one conductive land forming an inductor on at least one main surface thereof; a pair of intermediate layers, which are made of a non-metal material and provided on both main surfaces of the electronic component core; at least a pair of shielding electrode layers which are provided on both surfaces of the intermediate layers and out of connection with the ground; and a pair of protective layers provided on both outer surfaces of the shielding electrode layers.

The electronic component core may be formed of multiple layers, and conductive lands provided between the above multiple layers may be serially connected to form a coiled inductor.

The above objects are also fulfilled by an electronic component comprising an electronic component core, wherein an upper conductive land and a lower conductive land, at least one of them involving and inductor portion, are formed on both main surfaces of a core layer formed of a non-metal material; a pair of intermeidate layers, which are made of a non-metal material and provided on both main surfaces of the electronic core; at least a pair of shielding electrode layers which are provided on both outer surfaces of the intermediated layers and out of connection with the ground; and a pair of protective layers provided on both outer surfaces of the shielding electrode layers.

The above objects are also fulfilled by an electronic component production method comprising a first step of producing an electronic component core, wherein at least one conductive land is provided on at least one core layer; a second step of forming a laminated body, wherein a protective layer, a shielding electrode layer, an intermediate layer, the electronic component core, another intermediate layers, another shielding electrode layer and another protective layer are laminated in the above order; and a third step of baking the laminated body.

The above objects are also fulfilled by an electronic component production method comprising a first step of producing an electronic component core, wherein conductive lands provided between multiple layers are serially connected; a second step of forming a laminated body, wherein a protective layer, a shielding electrode layer, an intermediate layer, the electronic component core, another intermediate layer, another shielding electrode layer and another protective layer are laminated in the above order; and a third step of baking the laminated body.

The above objects are also fulfilled by an electronic component production method comprising a first step of producing an electronic component core, wherein an upper conductive land and a lower conductive land, at least one of them involving an inductor portion, are formed on both main surfaces of a core layer formed of a dielectric material; a second step of forming a laminated body, wherein a protective layer, a shielding electrode layer, an intermediate layer, the electronic component core, another intermediate layer, another shielding electrode layer and another protective layer are laminated in the above order; and a third step of baking the laminated body.

According to this invention, an electronic component core and shielding electrode layers interpose intermediate layers made of a non-metal material. These intermediate layers prevent the electronic component core from deteriorating its Q factor. If the intermediate layers are thickened, the greater effect is obtained.

The above intermediate layers mainly cut off the electric field, and the non-grounded shielding electrode layers mainly cut off the magnetic field. Furthermore, protective layers are provided on the outer surfaces of the shielding electrode layers in order to keep the magnetic permeability of the shielding electic layers at a certain level. The above facts prevent the frequency characteristic of the electronic component from declining.

Since baking is done after all layers are laminated into a laminated body, the production process is extremely simplified and so the production cost is reduced.

BRIEF DESCRIPTION OF THE DRAWINGS

These and other objects, advantages and features of the invention will become apparent from the following description thereof taken in conjunction with the accompanying drawings which illustrate specific embodiments of the invention. In the drawings.

DESCRIPTION OF THE PREFERRED EMBODIMENTS

Embodiment 1

Figure 4:
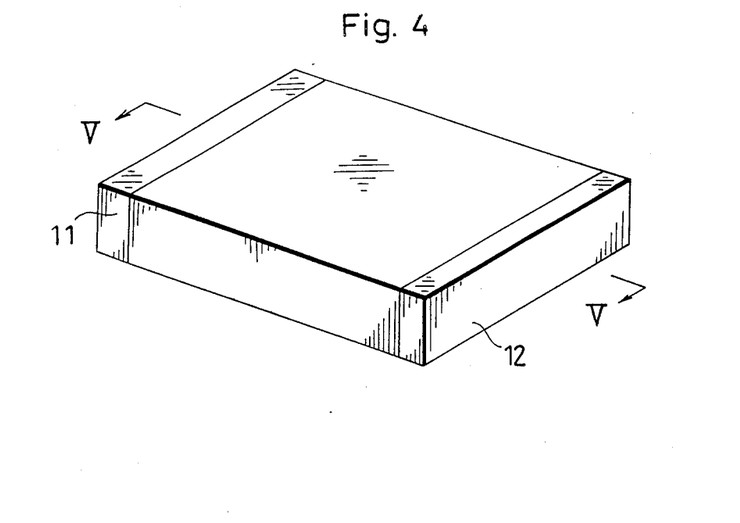
FIG. 4 is a perspective view of an inductor according to this invention.
Figure 5:
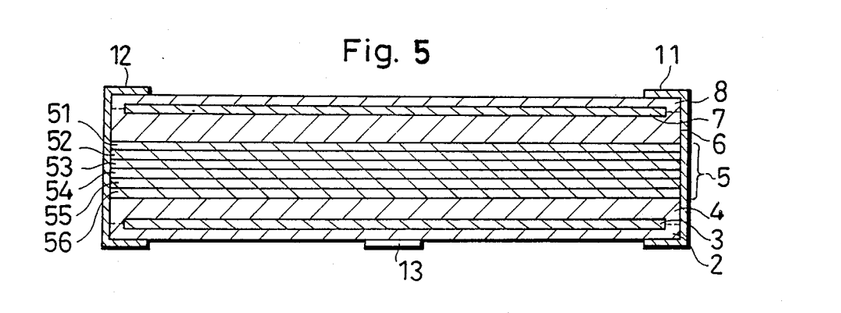
FIG. 5 is a cross sectional view along the V—V line of FIG. 4.
Figure 6:
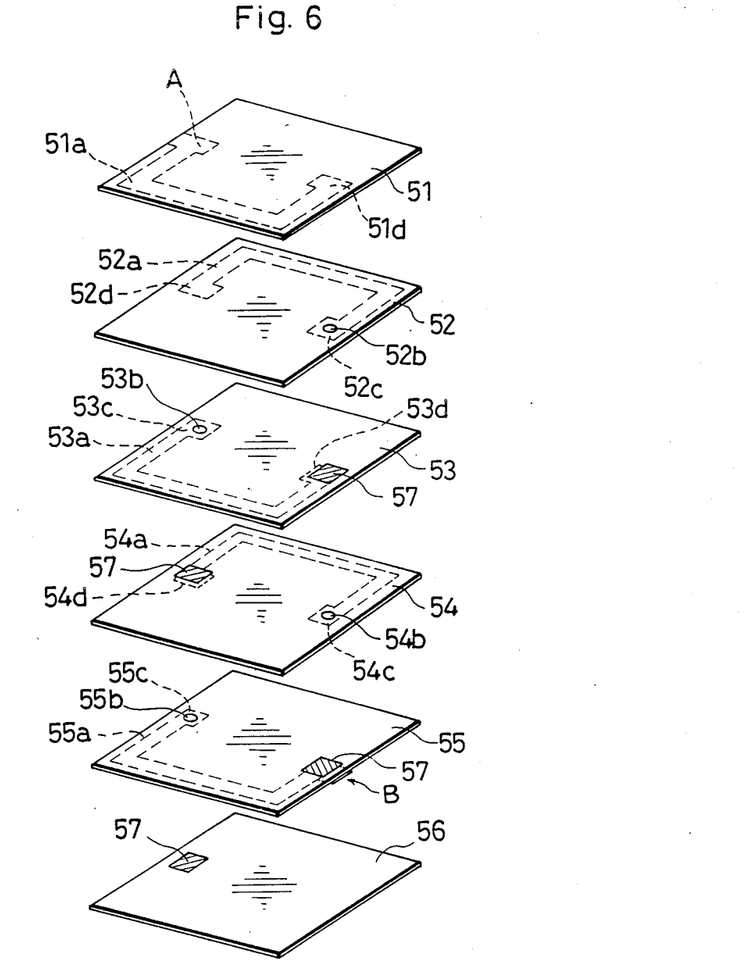
FIG. 6 is an exploded perspective view of an inductor core of the above inductor according to this invention.

FIG. 4 is a perspective view of an inductor according to this invention, and FIG. 5 shows a cross section along the V—V line of FIG. 5. This inductor is a rectangular parallelopiped comprising multiple layers laminated as shown in FIG. 5. It has an input terminal 11 and an output terminal 12 respectively on opposed sides thereof. It also has an L-shaped grounding film terminal 13 extended from the lower part of one of the remaining sides to the bottom surface thereof. A lowermose layer 2 and a uppermost layer 8 of this inductor are 20 to 50 $\mu$m thick protective sheets formed of a dielectric or insulating material. Layers 3 and 7 provided inside the layers 2 and 8 are shielding electrodes, and layers 4 and 6 provided inside the layers 3 and 7 are 1 to 1.5 mm thick intermediate sheets formed of a dielectric material. A layer 5 interposed by the layers 4 and 6 is an inductor core. The inductor core 5 comprises dielectric sheets 51 to 56 (thickness: 20 to 50 $\mu$m each) formed of $BaO$-$SiO_2$-$ZrO_2$. As shown in FIG. 6, the upper five sheets 51 to 55 of the inductor core 5 have conductive lands 51a to 55a respectively on the bottom surfaces thereof. The conductive lands 51a to 55a are substantially C-shaped and are arranged alternately.

The conductive land 51a has an input terminal portion A at one end thereof (the left end in FIG. 6), which is exposed on the same side of the dielectric sheet 51. The conductive land 51a has a connection portion 51d at the other end thereof. The conductive land 52a has a connection portion 52c at the same end as the connection portion 51d. 51d and 52c are connected with each other by a conductive agent filling up a via hole 52b provided on the upper surface of the dielectric sheet 52. The dielectric sheet 53 has a contact 57, which is obtained by pasting a conductive agent on its upper surface at the position facing the connection portion 52c. The above contact 57 secures the connection between 51d and 52c. Connection portions 52d and 53c, 53d and 54d, 54d and 55c are connected with each other in the same manner. The conductive lands 51a, 52a, 53a, 54a and 55a constitute a coiled inductor. The conductive land 55a has an output terminal portion B on the opposite end from 55c, and the output terminal portion B is exposed on the opposite side of the dielectric layer 55 from the output terminal portion A.

Such an inductor is produced as explained below.

The six dielectric sheets 51 to 56 have the followings formed on the upper or bottom surfaces thereof: the conductive lands 51a to 55a, the connection portions 51d to 54d and 52c to 55c, the via holes 52b to 55b, the contacts 57, the input terminal portion A, the output terminal portion B. The via holes 52b to 55b are filled with conductive agents. Then, the dielectric sheets 51 to 56 are laminated. Inductor core 5 is thus obtained.

As shown in FIG. 5, the inductor core 5 is interposed by the pairs of intermediate sheets 4 and 6, shielding electrodes 3 and 7, and protective sheets 2 and 8 in this order. The input terminal 11 and the output terminal 12 are respectively formed on the side of the inductor where the input terminal portion A and the output terminal portion B are exposed. In this way, the input terminal 11 is connected with the input terminal portion A, and the output terminal 12 with the output terminal portion B. The obtained item is baked to produce an inductor.

In the above embodiment, the layers are baked after they are laminated, which extremely simplifies the production proces and thus remarkably reduces the production cost.

Between the inductor core 5 and the shielding electrodes 3 and 7 are the intermediate sheets 4 and 6 formed of a non-magnetic insulating or dielectric material. Therefore, the Q factor of the inductor core 5 does not decline even if the layers are baked after laminated.

The above intermediate sheets 4 and 6 mainly cut off the electric field, and the non-grounded shielding electrodes 3 and 7 mainly cut off the magnetic field. Furthermore, the protective sheets 2 and 8 are formed outside the shielding electrodes 3 and 7, in order to keep the magnetic permeability of the shielding electrodes 3 and 7 from being dropped by a metal or other conductors. The above facts prevent the frequency characteristic of the inductor from dropping.

Since the input and output terminals 11 and 12 are exposed outside, the inductor can be surface mounted on a circuit board, etc.

Figure 8:
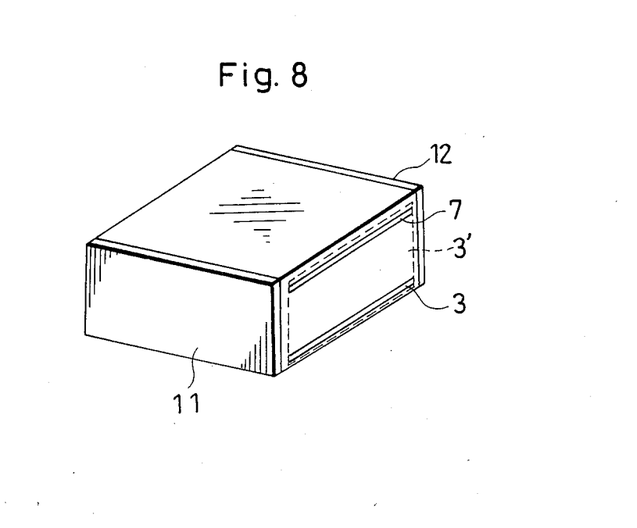
FIG. 8 is a perspective view of another inductor according to this invention.

Although the inductor core is shielded by a pair of shielding electrodes 3 and 7 in the above embodiment, the construction in FIG. 8 is also possible. As well as 3 and 7, a pair of shielding film electrodes 3' (one of them shown with a dashed line) may be formed on the sides of the inductor where the input and output terminals 11 and 12 are not formed. This construction shields the inductor more securely, and is applicable to a bandpass filter and a duplexer described in Embodiments 2 and 3 and other electronic components.

Figure 7:
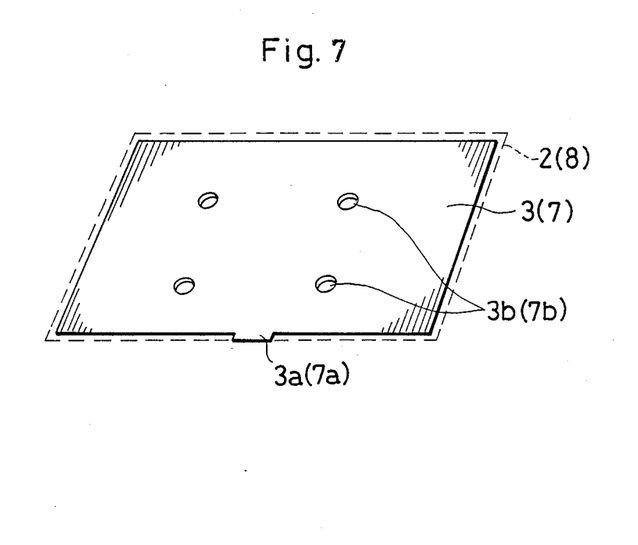
FIG. 7 is a perspective view of a shielding electrode which is preferably employed in an embodiment of this invention.
Figure 9A:
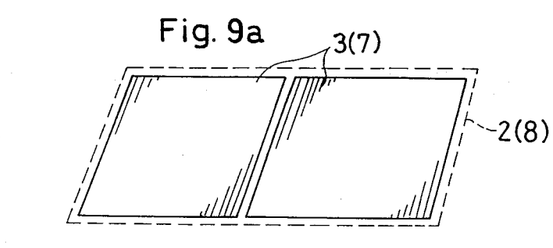
FIGS. 9a and 9b are perspective views of another shielding electrode which is preferably employed in an embodiment of this invention.
Figure 9B:
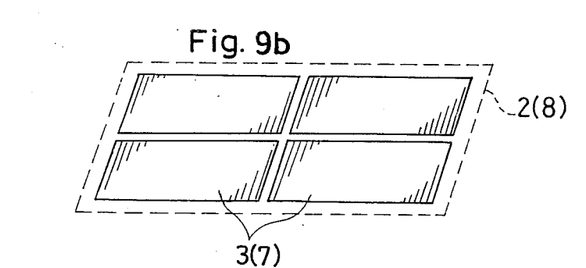

In the above embodiment, the inductor is not equipped with a grounding terminal. If it is equipped with one, it is not necessary to connect the grounding terminal to the shielding electrodes 3 and 7. As shown in FIG. 7, the shielding electrodes 3 and 7 are preferably a little smaller than the protective sheets 2 and 8 interposing them, and also preferably have multiple (four in this embodiment) windows 3b and 7b in order to be adhered more strongly on the layers above and below them. The construction in FIGS. 9 (a) and 9 (b) is also applicable. At least one of the shielding electrodes 3 and 7 is divided into two or four. The divided portions are separated from one another and interposed by the layers above and below them. The above two constructions are preferably applied to the bandpass filter and the duplexer in Embodiments 2 and 3 and other electronic components.

Embodiment 2

Figure 10:
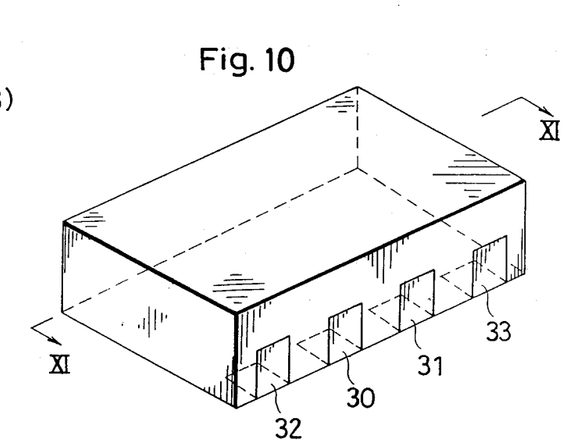
FIG. 10 is a perspective view of a bandpass filter according to this invention.
Figure 11:
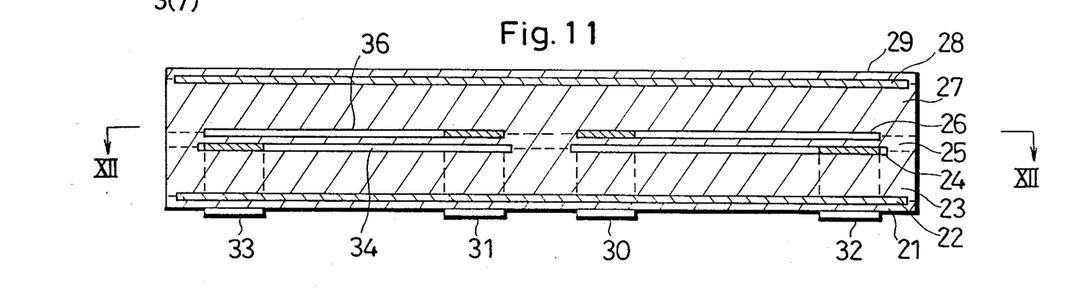
FIG. 11 is a cross sectional view along the XI—XI line of FIG. 10.
Figure 12:
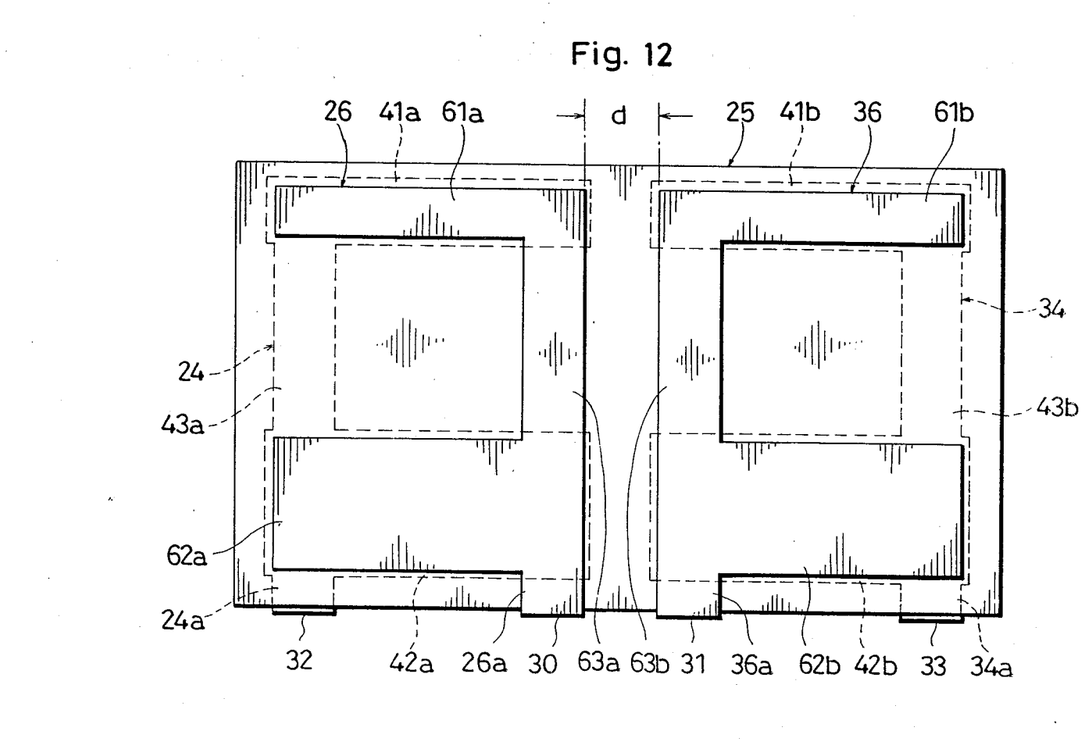
FIG. 12 is a cross sectional view along the XII—XII line of FIG. 11.

FIG. 10 is a perspective view of the bandpass filter according to this invention, FIG. 11 shows a cross section along the XI—XI line of FIG. 10, and FIG. 12 shows a cross section along the XII—XII line of FIG. 11.

This bandpass filter comprises laminated multiple layers as in FIG. 11. The layers are, from bottom to top, a protective sheet 21 formed of a dielectric or insulating material (thickness: 20 to 50 μm), a shielding electrode 22, an intermediate sheet 23 formed of a non-magnetic dielectric or insulating material (thickness: 1 to 1.5 mm), lower conductive lands 24 and 34 formed of such a conductive material as copper, a dielectric sheet 25 formed of $BaO\text{-}SiO_2\text{-}ZrO_2$ (thickness: 20 to 50 μm) upper conductive lands 26 and 36 formed of such a conductive material as copper, another intermediate sheet 27 formed of a non-magnetic dielectric or insulating material (thickness: 1 to 1.5 mm), another shielding electrode 28, and another protective sheet 29 formed of a dielectric or insulating material (thickness: 20 to 50 μm).

The dielectric sheet 25, the conductive lands 26, 36, 24 and 34 constitute a bandpass filter core, the top view of which is shown in FIG. 12. The dielectric sheet 25 has substantially C-shaped conductive lands 26 and 36 on the upper surface and 24 and 34 on the bottom surface thereof. The conductive land 24 copmprises a pair of capacitor electrodes 41a and 42a and an inductor portion 43a. The conductive land 26 comprises a pair of capacitor electrodes 61a and 62a and an inductor portion 63a. The conductive land 34 comprises a pair of capacitor electrodes 41b and 42b and an inductor portion 43b. The conductive land 36 comprises a pair of capacitor electrodes 61b and 62b and an inductor portion 63b. The above pairs of capacitor electrodes 41a and 61a, 42a and 62a, 41b, and 61b, 42b and 62b are opposed to each other with the dielectric sheet 25 therebetween. They are arranged in this way to form capacitors C1, C2, C3 and C4, respectively. The capacitances of these capacitors depend on the dielectric constant and thickness of the dielectric sheet 25, and on the surface area where one of the capacitor electrode pair oppose the other. The inductor portions 43a, 63a, 43b and 63b, which are not opposed to each other with the dielectric sheet 25 therebetween, constitute an inductor in a high frequency range. Their respective inductances are L1, L2, L3 and L4.

The lower conductive land 24 and the upper conductive land 26 have projecting portions 24a and 26a respectively, which extend to one same side of the bandpass filter. The exposed parts of 24a and 26a are respectively connected to L-shaped film terminal electrodes 32 and 30 of FIG. 10, which are insulated from each other and also form the other layers.

The lower conductive land 34 and the upper conductive alnd 36 have the same construction.

Figure 13:
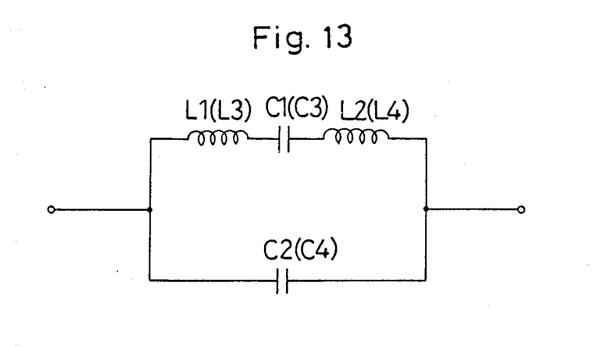
FIG. 13 is an equivalent circuit diagram of the resonators of the above bandpass filter.
Figure 14:
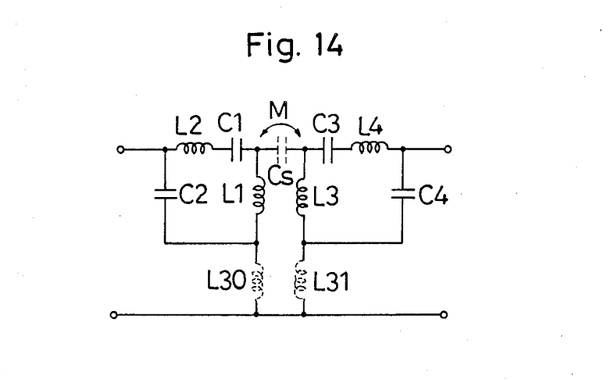
FIG. 14 is an equivalent circuit diagram of a bandpass filter core of the above bandpass filter.

In the above construction, the pairs of conductive lands 24 and 26, 34 and 36 form resonators Q1 and Q2, respectively. Q1 is expressed with an equivalent circuit of FIG. 13, where an LC series circuit, comprising a first capacitor C1 and inductors L1 and L2 connected to both ends thereof, is parallelly connected to both ends thereof, is parallelly connected with a second capacitor C2. Q2 is expressed with an equivalent circuit, where another LC series circuit, comprising another first capacitor C3 and inductors L3 and L4 connected to both ends thereof, is parallelly connected with another second capacitor C4. As in FIG. 12, such resonators Q1 and Q2 are arranged side by side with a spacing d between the inductor portions 63a and 63b. Consequently, the inductor portions 63a and 63b are magnetically coupled with each other to form a bandpass filter having an equivalent circuit shown in FIG. 14. M is a mutual inductance indicating the magnetic coupling strength, and L30 and L31 are inductances of the film terminal electcrodes 30 and 31, respectively. Since the resonators Q1 and Q2 employ the dielectric sheet 25, capicatance coupling occurs as well as magnetic coupling. Cs indicates the totoal of the coupled capicitances.

The shielding electrodes 22 and 28 are not grounded.

How to produce a bandpass filter having such a construction will be explained below.

A paste of conductive material such as copper is screen-printed or coated on the surface of the protective sheet 21 to form the shielding electrode 22. In the same manner, the substantially C-shaped lower conductive lands 24 and 34 which respectively have the projecting portions 24a and 34a at one ends thereof are symmetrically formed on the upper surface of the intermediate sheet 23. Again in the same manner, the substantially C-shaped upper conductive lands 26 and 36 which respectively have the projecting portions 26a and 36a at one ends thereof are symmetrically formed on the upper surface of the dielectric sheet 25. The shielding electrode 28 is formed on the upper surface of the intermediate sheet 27 in the same manner. The above sheets 23, 25, 27 and 29 are laminated on the protective sheet 21 in this order, and they are pressure-bonded to form a laminated body. Then, a paste of a conductive material such as copper or silver is printed on the side of the laminated body on which the projecting portions 24a, 34a, 26a and 36a are exposed and on the bottom surface extended form the above side, whereby to form the L-shaped film terminal electrodes 32, 33, 30 and 31. After that, the laminated body is baked for two hours at, for example 1,000C. The obtained is a bandpass filter.

The bandpass filter core, which are easily affected by the external magnet field and conductors, is effectively shielded by the shielding electrodes 28 and 22 with the intermediate sheets 27 and 23 therebetween. The frequency characteristic of the bandpass filter can be adjusted by changing the thickness of at least one of the intermediate sheets 27 and 23. How to make such an adjustment will be explained below. Here, the adjustment is described by changing the thickness of the intermediate sheet 27.

When the central frequency is higher than the desired level, the intermediate sheet 27 is thickened. In consequence, the shielding electrode 28 is farther from the bandpass filter core, whereby the central frequency is lowered. In other words, the frequency is modified from a curve 1 to a curve 3 of FIG. 15.

Figure 15:
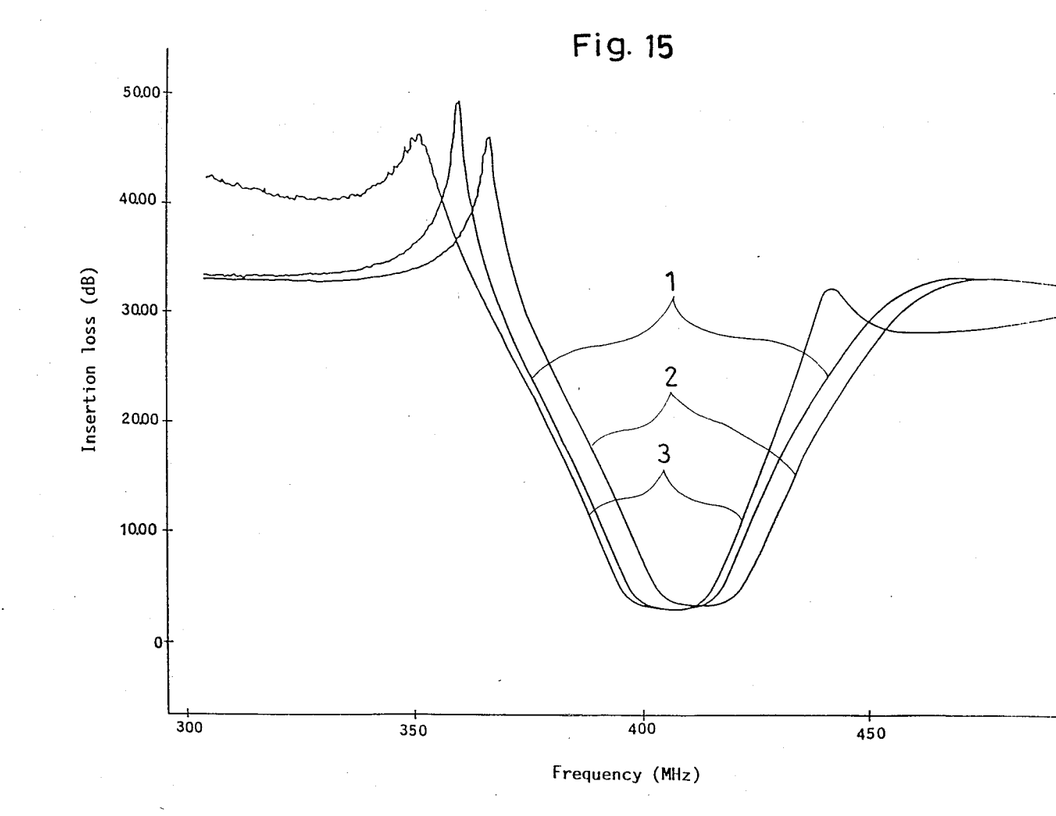
FIG. 15 shows the frequency characteristic of the above bandpass filter.

When the central frequency is lower than the desired level, the intermediate sheet 27 is thinned. In consequence, the shielding electrode 28 is closer to the bandpass filter core, whereby the central frequency is raised. In other words, the frequency is modified from the curve 1 to a curve 2.

The above intermediate sheets 27 and 23 can be uniform in their respective thickness. If they are uniform, the shielding electrode 28 is in parallel with the upper conductive lands 26 and 36, and the shielding electrode 22 is in parallel with the lower conductive lands 24 and 34. The distances between 28 and 26–36, and between 22 and 24–34 can also be uniform, for example, at 1 mm or more. By this construction, the shielded bandpass filter is prevented from deteriorating its electric characteristics.

Although the upper conductive lands 26 and 36, the lower conductive lands 24 and 34, and the shielding electrodes 22 and 28 are formed by printing or coating in the above embodiment, other methods are also possible. For instance, they may be conductive sheets which are laminated along with the dielectric sheets 23, 25 and 27 in the same order as in the above embodiment. Also possible is that at least one of the upper conductive land pair 26–36, the lower conductive land pair 24–34, one of the shielding electrodes 22, and the other shielding electrode 28 is a conductive sheet and that the others are formed by printing or coating.

Each of the sheets 21, 23, 25, 27 and 29 may comprise a sheet, or multiple laminated sheets made of the same material.

The shielding electrodes 22 and 28, the lower conductive lands 24 and 34, and the upper conductive lands 26 and 36 do not have to be provided on the above-mentioned positions. For example, the shielding electrode 22 may be formed on the bottom surface of the intermediate sheet 23, not on the upper surface the protective sheet 21.

Needless to say, the laminated layers do not have to be pressure-bonded.

Although the laminated body is baked after the film terminal electrodes 30, 31, 32 and 33 are formed in the above embodiment, the film terminal electrodes 30, 31, 32 and 33 are formed after the laminated body is baked.

Embodiment 3

Figure 16:
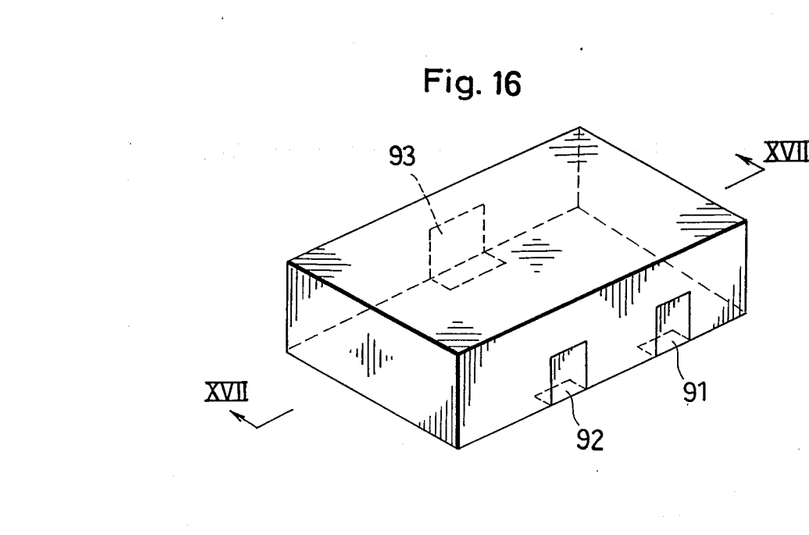
FIG. 16 is a perspective view of a duplexer according to this invention.
Figure 17:
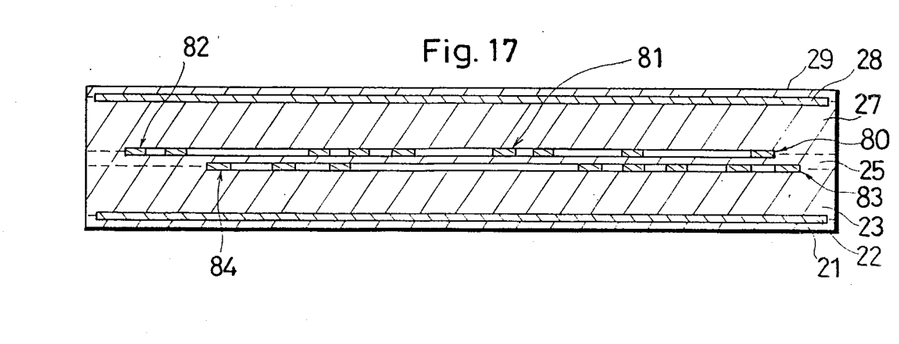
FIG. 17 is a cross sectional view along the XVII—XVII line of FIG. 16.

FIG. 16 is a perspective view of a duplexer according to this invention, and FIG. 17 shows a cross section along the XVII—XVII line of FIG. 16. The parts shown in FIG. 11 have the identical numbers and will not be explained here. This duplexer comprises the same number of layers which are respectively formed of the same materials as the bandpass filter of Embodiment 2.

As apparent from FIG. 17, however, this duplexer has a different construction for upper and lower conductive lands from that of Embodiment 2.

Figure 18:
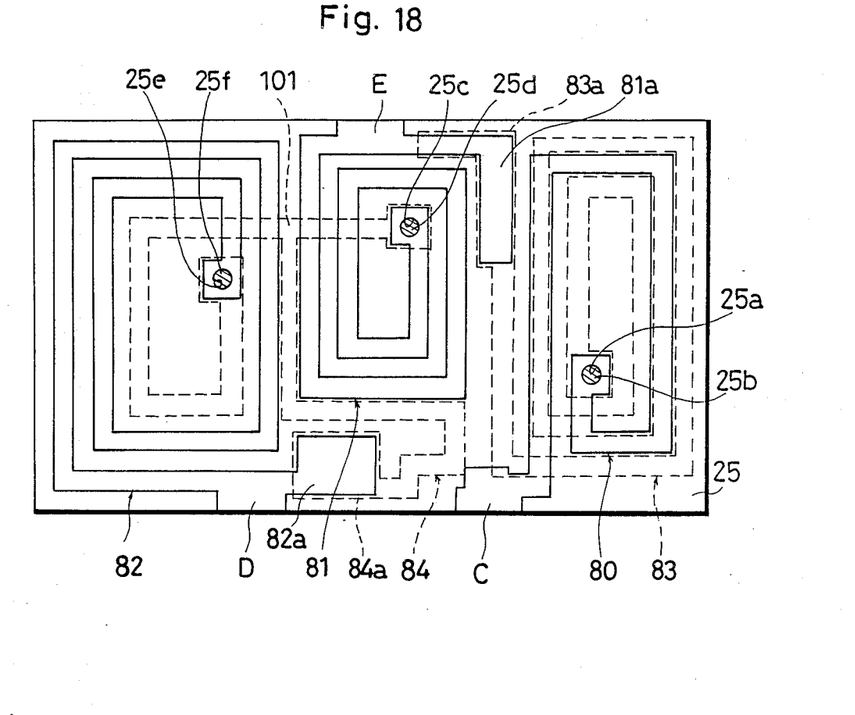
FIG. 18 is a top view of a duplexer core of the above duplexer.
Figure 19:
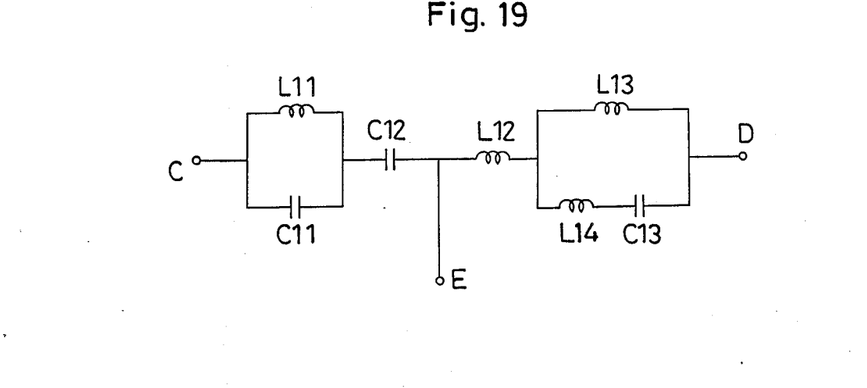
FIG. 19 is an equivalent circuit diagram of the above duplexer core.

Three upper conductive lands 80, 81 and 82 are arranged on the upper surface of the dielectric sheet 25 as illustrated in FIG. 18, and two lower conductive lands 83 and 84 are arranged on the bottom surface of the dielectric sheet 25 also as illustrated in FIG. 18. FIG. 19 shows an equivalent circuit of a duplexer core, which comprises the dielectric sheet 25 and the conductive lands 80 to 84.

The upper conductive land 80 has a low input terminal portion C at one end thereof, and is connected with the lower conductive land 83 through a through hole 25a at the other end thereof. The through hole 25a passes through the dielectric sheet 25 and is filled up with a conductive agent 25b. 80 and 83 constitute a coiled inductor L11, and the opposed portions of them constitute a capacitor C11, whereby C11 and L11 are connected in parallel. 83 has an end 83a, which is not connected with 80. This end 83qi a q1 and an end 81a of 81 constitute another capacitor C12. C12 is connected with an output terminal portion E.

81 and 84 are connected with each other through another through hole 25c filled up with a conductive agent 25d. 81 between 25c and E and 84 between 25c and a branching point 101 constitute another coiled inductor L12. 84 is connected with 82 through still another through hole 25e filled up with a conductive agent 25f. 84 has an end 84a, which is not connected with 82. 84 beyond 101 and before 84a forms still another inductor L14. The above end 84a and an end 82a of 82, which is not connected with 84 constitute still another capacitor C13. The capacitor C13 is connected to the high input terminal portion D.

In the above construction, the input terminal portions C and D, and the output terminal portion E are exposed on opposed sides of the dielectric sheet 25. The low input terminal portion C is connected with a low input terminal 91 (FIG. 16), the high input terminal portion D with a high input terminal 92, and the output terminal portion E with an output terminal 93. As shown in FIG. 16, the above terminals 91 and 92 are provided on the same side with C and D, and the terminal 93 with E. All the three terminals are L-shaped.

The shielding electrodes 22 and 28 are not grounded.

As the above description apparently shows, the duplexer according to this invention has the same effects as the inductor of Embodiment 1 does.

Although the present invention has been fully described by way of embodiments with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An electronic component comprising:
   an electronic component core having upper and lower main surfaces, said electronic component core including at least one core layer formed of a non-metal material, which has at least one conductive land forming an inductor on at least one main surface thereof;
   a pair of intermediate layers, which are made of non-metal material and formed on both said upper and lower main surfaces of said electronic component core;
   at least a pair of shielding electrode layers are out of connection with ground;
   a pair of protective layers formed on top of said shielding electrode layers; and
   input and output terminals formed on outside surfaces of said layers.

2. An electronic component claimed in claim 1, wherein the core layer is formed of a dielectric mateial.

3. An electronic component claimed in claim 1, wherein the core layer is formed of an insulating material.

4. An electronic component claimed in claim 1, wherein said electronic component core is formed of multiple layers and wherein conductive lands formed between the above multiple layers are serially connected to form a coiled inductor.

5. An electronic component claimed in claim 4, wherein the conductive lands are substantially C-shaped and arranged alternately, and wherein each of the conductive lands is connected with its adjacent conductive land.

6. An electronic component claimed in claim 1, wherein said intermediate layers are formed of a dielectric material.

7. An electronic component claimed in claim 1, wherein said intermediate layers are formed of an insulating material.

8. An electronic component claimed in claim 1, wherein said protective layers are formed of a dielectric material.

9. An electronic component claimed in claim 1, wherein said protective layers are formed of an insulating material.

10. An electronic component claimed in claim 1, wherein at least one of said shielding electrode layers has at least one window.

11. An electronic component claimed in claim 1, wherein at least one of said shielding electrode layers is divided into two or more.

12. An electronic component comprising:
    an electronic component core having upper and lower main surfaces, said electronic component core including a core layer formed of a non-metal material, which has an upper conductive land and a lower conductive land on main surface thereof, at least one of said upper and lower conductive lands having an inductor portion;
    a pair of intermediate layers, which are made of non-metal material and formed on both said upper and lower main surfaces of said electronic component core;
    at least a pair of shielding electrode layers which are formed of a metal material on top of said intermediate layers and said shielding electrode layers are out of connection with ground;
    a pair of protective layers formed on top of said shielding electrode layers and
    input and output terminals formed on outside surfaces of said layers.

13. An electronic component claimed in claim 12, wherein said electronic component core is a bandpass filter core.

14. An electronic component claimed in claim 12, wherein said electronic component core is a duplexer core.

15. An electronic component claimed in claim 12, wherein each of said intermediate layers is modified in its overall thickness for frequency characteristic adjustment.

16. An electronic component claimed in claim 12, wherein at least one member among the upper conductive land, the lower conductive land, one of said shielding electrode layers, and the other of said shielding electrode layers is formed of a conductive sheet.

17. An electronic component claimed in claim 12, wherein at least one member among one of said protective layers, the other of said protective layers, one of said intermediate layers, the other of said intermediate layers, and the core layer is formed of multiple sheets.

18. An electronic component production method comprising the steps of:
    producing an electronic component core, wherein at least one conductive land is provided on at least one core layer;
    forming a laminated body, wherein a protective layer, a shielding electrode layer, an intermediate layer, the electronic component core, another intermediate layer, another shielding electrode layer and another protective layer are laminated in the above order; and
    baking the laminated body.

19. An electronic component production method claimed in claim 18, wherein said second step involves modification of the thickness of each intermediate layer for frequency characteristic adjustment.

20. An electronic component production method comprising the steps of:
    producing an electronic component core, wherein conductive lands provided between multiple layers are serially connected;
    forming a laminated body, wherein a protective layer, a shielding electrode layer, an intermediate layer, the electronic component core, another intermediate layer, another shielding electrode layer and another protective layer are laminated in the above order; and
    baking the laminated body.

21. An electronic component production method comprising the steps of:

producing an electronic component core, wherein an upper conductive land and a lower conductive land are formed on main surfaces of a core layer which is formed of a dielectric material, at least one of said upper and lower conductive lands having an inductor portion;

forming a laminated body, wherein a protective layer, a shielding electrode layer, an intermediate layer, the electronic component core, another intermediate layer, another shielding electrode layer and another protective layer are laminated in the above order; and baking the laminated body.

* * * * *